(12) United States Patent
Ottermann et al.

(10) Patent No.: US 7,064,483 B2
(45) Date of Patent: Jun. 20, 2006

(54) PROCESS FOR PRODUCING ORGANIC LIGHT-EMITTING DIODES, AND ORGANIC LIGHT-EMITTING DIODE

(75) Inventors: Clemens Ottermann, Hattersheim (DE); Bernd Schultheis, Schwabenheim (DE); Holger Köbrich, Flörsheim (DE); Dirk Hertel, Wiesbaden (DE); Ruth Effenberger, Undenheim (DE); Klaus Michael Hammerl, Martinsthal (DE)

(73) Assignee: Schott Glas, Mainz (DE)

( * ) Notice: Subject to any disclaimer, the term of this patent is extended or adjusted under 35 U.S.C. 154(b) by 148 days.

(21) Appl. No.: 10/787,904

(22) Filed: Feb. 26, 2004

(65) Prior Publication Data

US 2004/0164674 A1 Aug. 26, 2004

(30) Foreign Application Priority Data

Feb. 26, 2003 (DE) .................................. 103 08 515

(51) Int. Cl.
*H01L 51/00* (2006.01)
*H05B 33/00* (2006.01)

(52) U.S. Cl. .................... 313/504; 313/512; 445/25; 427/66

(58) Field of Classification Search ................ 313/504, 313/512, 510, 506; 445/23–25; 427/66; 428/917
See application file for complete search history.

(56) References Cited

U.S. PATENT DOCUMENTS

| | | | |
|---|---|---|---|
| 3,201,633 A | 8/1965 | Lieb | 313/108 |
| 3,680,237 A * | 8/1972 | Finnerty, Sr. | 40/544 |
| 4,394,600 A * | 7/1983 | Flannagan | 313/500 |
| 4,733,488 A * | 3/1988 | Yokoyama et al. | 40/544 |
| 5,660,573 A | 8/1997 | Butt | 445/24 |
| 6,107,452 A | 8/2000 | Miller et al. | 528/422 |
| 6,203,391 B1 * | 3/2001 | Murasko | 445/24 |

FOREIGN PATENT DOCUMENTS

| | | |
|---|---|---|
| EP | 1006 169 A1 | 6/2000 |
| EP | 0 800 563 B1 | 7/2000 |
| EP | 0 573 549 | 10/2002 |
| JP | 07-289988 | 11/1995 |
| WO | WO 96/20253 | 7/1996 |
| WO | WO 98 03 043 | 1/1998 |

\* cited by examiner

*Primary Examiner*—Ashok Patel
(74) *Attorney, Agent, or Firm*—Ohlandt, Greeley, Ruggiero & Perle, L.L.P.

(57) ABSTRACT

The invention provides a process for producing an improved organic light-emitting diode (1) with a structured luminous area and a substrate (2), which comprises the steps of:
applying a first conductive electrode layer (5),
applying a resistive layer (7) having at least one structure (17),
applying at least one layer (11) which includes an organic, electroluminescent material, and
applying a second conductive electrode layer (13),
wherein the surface of the structure (17), in particular in its edge region (27), adopts an angle which remains less than 90° with respect to the surface of the substrate.

59 Claims, 7 Drawing Sheets

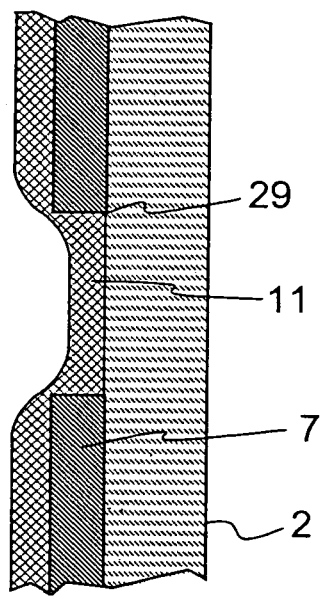
Fig. 3A
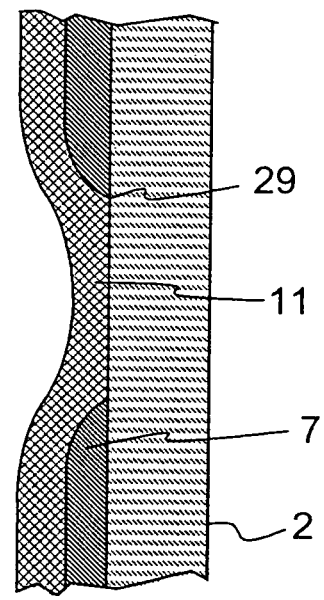
Fig. 3B
Fig. 4
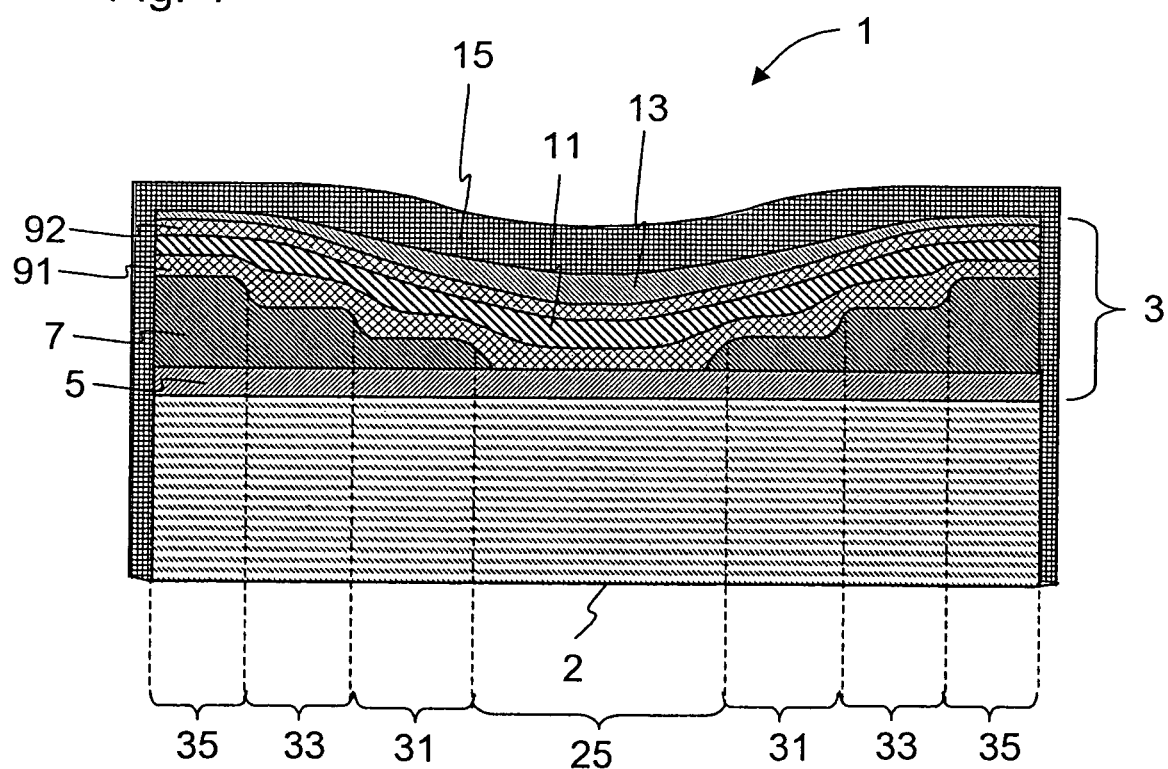

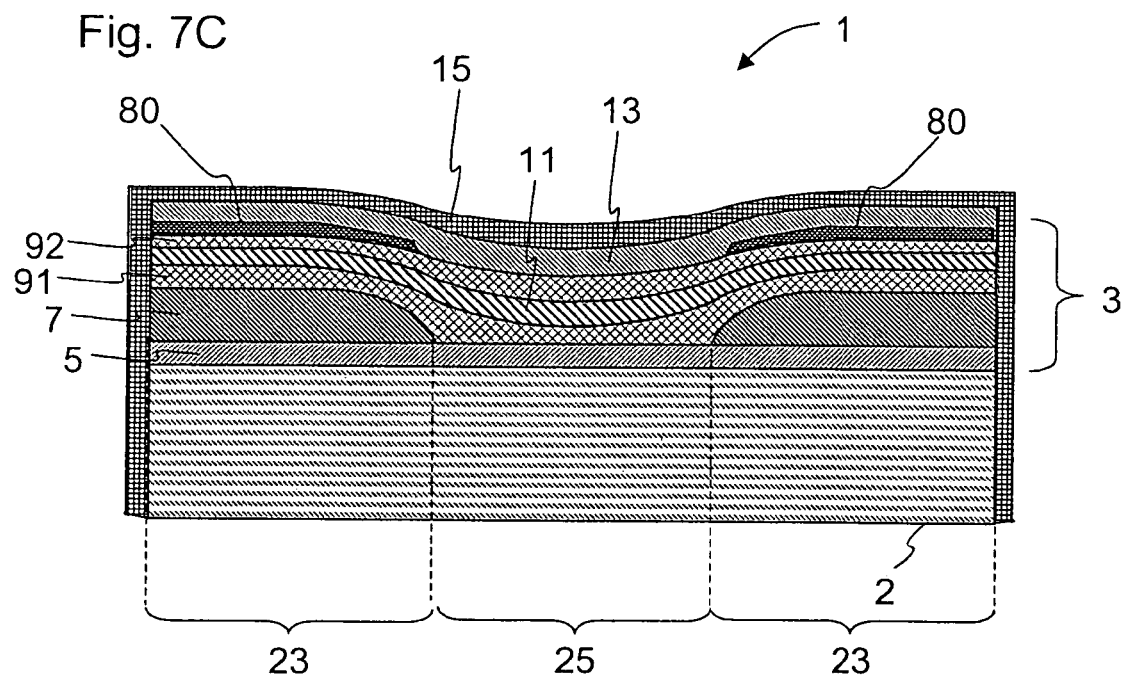
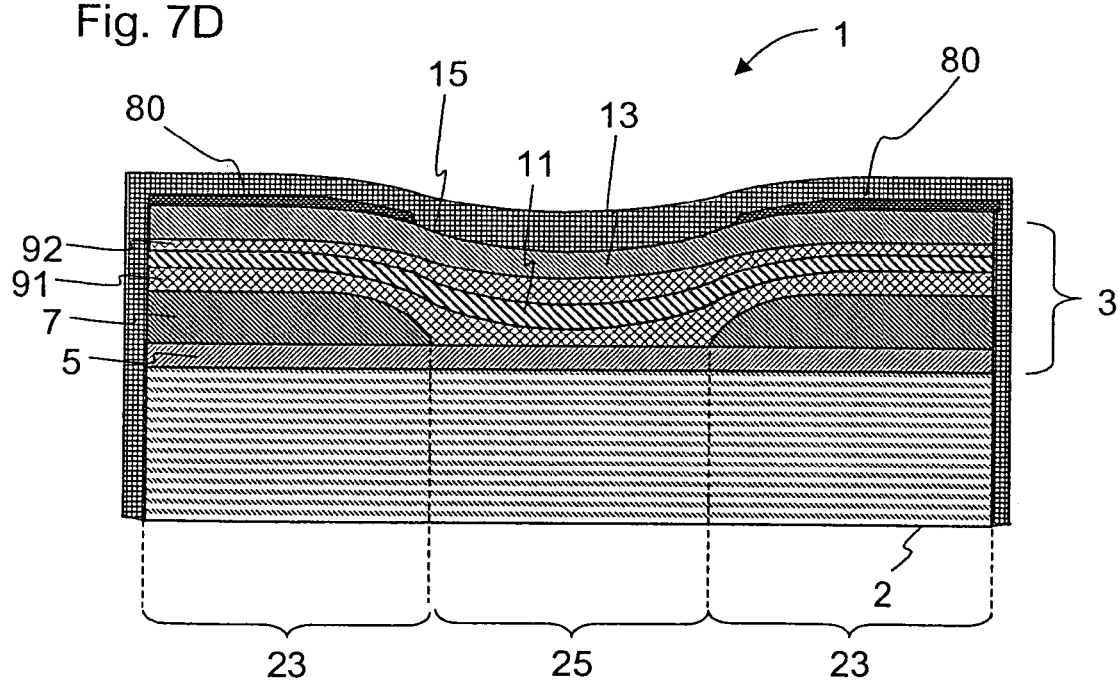

PROCESS FOR PRODUCING ORGANIC LIGHT-EMITTING DIODES, AND ORGANIC LIGHT-EMITTING DIODE

BACKGROUND OF THE INVENTION

1. Field of the Invention

The invention relates in general terms to a process for producing organic-light-emitting diodes and to an organic light-emitting diode (OLED). In particular, the invention relates to organic light-emitting diodes with a structured luminous area, and to a process for producing diodes of this type.

2. Description of Related Art

OLEDs are generally built up from an assembly of layers, i.e. a layer structure having an organic electroluminescent layer between two electrode layers, which is applied to a suitable substrate. In general, in an OLED, in each case one of the conductive layers acts as a cathode and the other as an anode. For this purpose, it is known to make the electrode layers from materials with different work functions, so that a work function difference is formed between these layers.

Organic light-emitting diodes (OLEDs) are distinguished by particular advantages over other luminous means. For example, OLEDs have highly promising properties for flat screens, since they allow a significantly wider viewing angle than, for example, LCDs or liquid crystal displays, and as self-illuminating displays also allow reduced current consumption to be achieved compared to backlit LCDs. Moreover, OLEDs can be produced as thin, flexible films which are particularly suitable for specific applications in illumination and display technology.

However, OLEDs are not only suitable for displays. They can be used in general terms as luminous means for a very wide range of applications, such as for example for self-illuminating signs and information boards.

However, the majority of these applications require structured luminous areas. Accordingly, local, fixed-position brightness differences have to be produced on the luminous area. To do this, there are in principle the following options:

The light emitted is modulated directly by laterally structured masking or filtering. For this purpose, an OLED may, for example, have diaphragms, perforated masks, opaque or colored coatings or films on the outer side of the OLED, absorptive or differently colored regions of the substrate on the outer or inner side.

The light emitted is modulated indirectly by the local current density being influenced by the organic electroluminescent layer. This can be achieved, for example, by suitable lateral structuring of the electrodes. It is also possible for the flow of current through the layer system of the OLED layer assembly to be interrupted by the additional presence of insulator structures or structures with a higher resistance in the layer assembly.

Moreover, it is also possible for the electroluminescent layer itself to be laterally structured.

Local direct modulation of the light flux is in widespread use for the production of LCD or OLED displays in which a broadband light spectrum, preferably white light, is tailored to the desired color loci by means of additional color filters in the light path. In addition, liquid crystal technology requires polarized light which is produced by suitable filtering of the incident light by means of polarizing sheets. A drawback of this is that the light has to be generated and is then partially absorbed again before it emerges from the component. For example, in LCD backlight displays, 60% of the light which is generated within the display is absorbed again in the polarizing sheets alone.

On the other hand, the structuring of the electroluminescent is layer requires special production techniques. For example, organic electroluminescent materials with molecular weights of <1000 amu, known as small molecules, which are suitable for evaporation coating are deposited in structured form by evaporation coating via shadow masks using the PVD process. However, in this case a large proportion of the very expensive electroluminescent material is deposited not on the substrate but rather on the shadow masks. Moreover, when carrying out structuring of this nature, the problem generally arises that, on account of shadowing effects and therefore the partial absence of a dielectric electroluminescent layer, short circuits can occur between the electrode layers, requiring considerably more complex layer structures and therefore more expensive production processes to prevent these short circuits.

By contrast, it is simpler to structure the electrodes or the electrode layers, for example by structured deposition of the electrode materials by means of shadow mask techniques using the PVD process. However, in this case too there is a risk of short circuits at the sharp edges of the electrode structures. A further drawback consists in the fact that in this technology all the structures of the electrode layers must be electrically conductively connected to one another. This problem can only be resolved to an inadequate extent by drawing conductive bridges between isolated structures of an electrode layer. These bridges have an adverse effect on the appearance, may even be illuminated themselves, and the current density passing through a bridge is significantly higher than the current density passing through large-area structures, resulting in a considerable voltage drop across a bridge, which in turn can lead to a lack of homogeneity in the illumination.

By contrast, the most simple option is to apply additional insulating structures in the OLED layer assembly. Possible production processes include evaporation coating through shadow masks or structured adhesive films. However, evaporation coating, sputtering or other PVD processes are complex and expensive vacuum-based processes. On the other hand, adhesive films typically have thicknesses in the region of 10 µm and are therefore generally significantly thicker than the layers of the OLED layer assembly, which are often in the region of only 0.1 µm. The films therefore considerably disrupt the microstructure of the OLED layer structure.

WO 9803043 proposes a process in which a structured insulator layer is applied by photolithography in order to produce a structured luminous area. For this purpose, by way of example, a photomask is produced by means of a printer. A photoresist is applied to the substrate, which has been coated with an indium tin oxide layer, and is then exposed and developed through the mask. In this process, therefore, the pattern which is to be reproduced on the luminous area cannot be transferred directly to the substrate. Rather, the pattern which is to be reproduced has to be produced in a number of intermediate steps on the substrate. When patterns are being produced in photoresist by means of photolithography, a further drawback arises. The edges of the resist structures are once again very sharp. This increases the risk of short circuits. A further particular drawback is in particular the fact that, on account of the sharp-edged structures on a substrate, cords and bubbles may form in layers which are subsequently applied by means of spin coating or dip coating, since the liquid film tends to become detached at these edges, so that its thickness lacks homogeneity. In this context, even subsequent rounding of the edges, as proposed in WO 9803043, provides only a little assistance, since the inner edges which adjoin the substrate remain in place.

A similar process is also proposed in JP 07-289988, in which a homogenous film is applied and is then structured by being exposed and developed, the result obtained being a structured polyurethane film on the electrode layer. Accordingly, the process described in this document has similar drawbacks to the production process disclosed by WO 9803043.

Furthermore, U.S. Pat. Nos. 5,660,573 and 3,201,633 describe electroluminescent capacitors in which the local brightness is likewise influenced by a structured dielectric interlayer. In this case, however, the brightness is influenced not by interrupting a flowing current but rather by influencing the local field strength by means of a lateral variation in the dielectric constant.

However, an electroluminescent capacitor has serious drawbacks compared to an organic light-emitting diode. The light yield is significantly worse. Moreover, operation of an electroluminescent capacitor requires high-frequency alternating current in order to sufficiently strongly excite the electroluminescent material. Provision of this is significantly worse compared to the low DC voltage which is suitable for operation of an OLED. Moreover, the high-frequency alternating voltage at the large-area electrodes leads to strong electromagnetic fields being radiated and/or to a considerable reduction in efficiency of the components as a result of reactive power losses.

SUMMARY OF THE INVENTION

The invention is therefore based on the object of providing an improved OLED which is simple and inexpensive to produce and has a structured luminous area.

Very surprisingly, this object is achieved by a process for producing an OLED as described in claim 1 and by an OLED as described in claim 34. Advantageous refinements form the subject matter of the corresponding subclaims.

Accordingly, the invention provides a process for producing an organic light-emitting diode having a substrate, which comprises the steps of:
- applying a first conductive electrode layer,
- applying at least one resistive layer having at least one structure,
- applying at least one layer which includes an organic, electroluminescent material, and
- applying a second conductive electrode layer.

In this method, the resistive layer is applied in such a way that the surface of the structure, in particular in its edge region, adopts an angle which remains less than 90° with respect to the surface of the substrate.

An organic light-emitting diode according to the invention, which can be produced in particular using the process according to the invention, accordingly comprises
- a substrate,
- a first conductive electrode layer which has been applied to the substrate,
- at least one layer which includes an organic, electroluminescent material, and
- a second conductive electrode layer
- a resistive layer as described above, having at least one structure with a surface which, in particular in its edge region, adopts an angle which remains less than 90° with respect to the surface of the substrate.

To achieve its effect, the structured resistive layer can be applied or arranged at any location within the layer assembly between the two electrodes. However, it is advantageous in particular for the layer to be applied as the first layer after the first conductive layer, since this makes the production procedure and layer structuring particularly simple and inexpensive to carry out.

After the OLED layer structure has been completed, the structure of the resistive layer is arranged between the first electrode layer and the second electrode layer and therefore leads to a reduction in the flow of current through the layer which includes the electroluminescent material in the region of the structure. The layer which includes the organic, electroluminescent material is also referred to below as the electroluminescent layer for short.

A wide range of substances which are known to the person skilled in the art can be used as organic, electroluminescent material for the electroluminescent layer. For this purpose, it is possible, inter alia, to use metalorganic material, in particular metalorganic complexes, such as triplet emitters or lanthanide complexes. By way of example, what are known as small molecules, i.e. molecules with a low molecular weight, or polymer materials are suitable for use as electro-luminescent material and are in widespread use for the production of OLEDs. Electroluminescent small molecules, such as for example tris-(8-hydroxyquinolino) aluminum ($Alq_3$) are generally deposited by means of PVD processes. Electroluminescent polymer materials, such as for example (poly(2-methoxy, 5-(2'-ethylhexyloxy)paraphenylene vinylene (MEH-PPV), are typically deposited from the liquid phase or by means of printing processes. The layer may also comprise an organic or inorganic matrix layer doped with emitters, such as for example fluorescent dyes, as organic, electroluminescent material Further electroluminescent substances are known to the person skilled in the art and are described, for example, in U.S. Pat. No. 6,107,452, EP 0 573 549, EP 800 563 A1, EP 800 563 B1 and EP 1 006 169 A1, which are hereby incorporated in their entirety by reference in the present application. Although known to the person skilled in the art, reference is also made to the way in which the OLED layer structure of the OLEDs described in these documents is built up, and this description is assumed to form part of the present application.

In the present invention, an OLED layer structure or layer assembly is understood to mean the layer structure comprising the conductive electrode layers and at least one electroluminescent layer arranged between these electrode layers. In addition to this at least one electroluminescent layer, it is also possible for further layers to be arranged between the electrode layers, such as for example electron-injecting and hole-injecting layers or hole-transporting or electron-transporting or blocking layers. The resistive layer arranged between the electrode layers is therefore likewise part of the OLED layer assembly.

Layers of the OLED are usually applied to the first electrode, such as in particular the organic electroluminescent layer. However, in the context of the present invention, it is particularly preferable for at least one further layer, such as in particular a transport layer or inducing layer, or the layer which includes an organic, electroluminescent material, to be applied by liquid coating. Accordingly, in a preferred embodiment of the diode, at least one layer which is applied to the first conductive electrode layer, in particular the layer which includes an organic, electroluminescent material, is a coating produced by liquid coating.

Examples of suitable liquid coating methods are spin coating and also in particular dip coating. A layer of this type which has been applied by liquid coating and then solidified has numerous advantages over an evaporation-coated layer. Liquid coating makes it possible to produce large-area coatings at significantly lower cost than would be possible by evaporation coating. This is true in particular of materials with a high molecular weight, which for reasons of thermal stability cannot be deposited using evaporation coating processes. For example, liquid coating can also be used to apply polymers, with their positive stability and elasticity properties.

According to the invention, the resistive layer is applied in such a way that steep flanks are avoided at the edge of the structure. Therefore, particularly in the edge region, the angle of the surface of the structure with respect to the surface of the substrate is less than 90°, so that therefore walls which are perpendicular to the surface of the substrate are avoided. As a result, by way of example, the liquid film is prevented from becoming detached or the formation of cords is avoided if a further layer applied to the structured resistive layer, such as for example the electroluminescent layer, is applied by means of liquid coating processes, such as for example spin coating. Steep flanks of the structure are also disadvantageous during subsequent dip coating, since they lead to a highly inhomogenous thickness distribution of the layer applied by dip coating. By contrast, dip coating or spin coating, since steep flanks of this type are not present in the resistive layer applied in accordance with the invention, can be used without problems in the process according to the invention to apply at least one further layer, such as a functional layer or in particular the electroluminescent layer, to the resistive layer.

The more acute the angle of the surface of the structure with respect to the surface of the substrate, the better this is for the layer quality of subsequent layers. It is therefore advantageous if not only surface regions of the structure of the resistive layer which are perpendicular to the surface of the substrate are avoided, but rather if the resistive layer is in fact applied in such a way that the surface of the structure, in particular in its edge region, adopts a maximum angle which remains less than 80°, preferably less than 60°, particularly preferably less than 45°, with respect to the surface of the substrate. In this context, it is particularly advantageous if the contact angle of the structure is within this range, since if coating material for the resistive layer is applied in liquid form, the maximum angle which occurs is the contact angle. If material shrinkage occurs during the solidification of the coating material, the final contact angle is reduced after the resistive layer has solidified, so that in this case the liquid coating material may even have a greater contact angle with respect to the surface of the substrate than the finished, solidified structure.

According to a further embodiment of the invention, the structure of the resistive layer is applied in such a way that the surface of the structure, in particular in it's edge region, adopts an angle which remains below 10° with respect to the surface of the substrate, and/or in which the contact angle remains less than 10°. With a flat-ended structure of this type, it is possible to achieve a particularly homogenous thickness of the layers deposited thereon.

Furthermore, it has proven particularly advantageous for the layer quality of layers applied subsequently if the resistive layer is applied in such a way that the aspect ratio of the edge zone or of the edge region of the structure remains less than 1, preferably less than 0.58.

The resistive layer is advantageously structured in such a way that the surface of the substrate can be divided into at least one region which is covered by the resistive layer and at least one region which is not covered, in order to achieve a structured luminous area.

If the resistive layer has a finite resistance, there continues to be a certain flow of current in a coated region as well, so that given a sufficient voltage drop across the electroluminescent layer this layer can still continue to emit, with a lower intensity. However, for many applications a structured luminous area which is divided into luminous and non-luminous regions is sufficient, analogous to an image with a color depth of one bit.

Accordingly, for these cases, the resistance of the resistive layer can be kept so high that the flow of current is interrupted in the regions which are covered by the resistive layer or the remaining voltage drop across the electroluminescent layer becomes too low for a perceptible emission of light. In this case, a layer of this type is referred to in the context of the present invention as an insulating layer. The abovementioned conditions for an insulating layer are generally satisfied in particular if the resistance of the insulating layer is greater than the resistance of the other layers of the OLED layer assembly between the electrode layers, or if the voltage drop across the resistive layer is greater than the voltage drop across the other layers of the OLED layer assembly.

To make it possible to produce different levels of brightness in a motif on the luminous area, it is necessary, unlike with a color depth of one bit, for the local brightness emerging from the luminous area to be varied. This can be achieved, for example, by the structure of the resistive layer having regions with a different electrical resistance in the direction in which the current flows, so that the local current passing through the electroluminescent layer varies.

One possible way of achieving this consists, for example, in applying a resistive layer with regions with a layer thickness which varies in steps. One simple way of producing a layer of this type is repeat coating with a coating material of the resistive layer, the number of times a region is coated increasing the greater the thickness is intended to be, or the higher its electrical resistance in the direction of flow of the current is intended to be. However, this can advantageously also be achieved in single-step coating processes, such as for example gray scale printing or halftone printing.

According to a further embodiment of the invention, the resistive layer may also be colored, for example by being provided with pigments. By way of example, for this purpose it is possible to apply a multilayered resistive layer, of which the successively applied layers may have different colors and/or shades. It is advantageously also possible for the single-layer or multilayered resistive layer to have a pattern or image, for example by laterally varying the pigments. The pattern or image may be in either single-color or multicolored form. Moreover, in this context it is advantageous if the OLED is constructed in such a way that the resistive layer is externally visible. An OLED of this type can therefore display information or provide an esthetic impression even when it is switched off. The colored pattern can then in this way also be visible in conjunction with the light from the luminescent layer, so that, by way of example, together with the luminous regions it contributes to giving an esthetic impression or to helping the information to be displayed.

Moreover, the resistive layer may be composed of a plurality of layers of different layer materials positioned one on top of the other. For this purpose, the layers with different layer materials can be applied in succession in a suitable way. The different layer materials may, in particular, each have different resistivities or colors. In this way, it is then possible to achieve even finer brightness or color graduation by means of a locally varying combination of the individual layers.

Yet another possible way of producing local, finely graduated differences in brightness, moreover, consists in applying a resistive or insulating layer with a grid structure. Accordingly, if the structure of the resistive layer comprises a grid, it is possible to adjust the mean flow of current in the region of the grid and therefore the amount of light which is emitted by means of the density of the grid, for example by means of the density or size of grid points of the resistive layer.

Furthermore, it is also possible to apply a further layer which has a local variation in the light absorption, for example by laterally varying pigments being present in the layer. This layer may, for example, be applied to the outer surface of the luminous area after the OLED layer structure has been completed. In this context, a local variation in the brightness is to be understood as meaning not just a variation in the total brightness. Rather, it is also possible to influence the brightness of spectral regions, for example the spectral intensity distribution of the emitted light, in order, for example, to change the color sensation. Furthermore, this is not possible by absorption alone. It is also possible for the pigments to comprise fluorescent dyes, so that the spectral intensity distribution of the emitted light is shifted.

Moreover, a resistive layer may be created in such a way that it has a further functionality. According to one embodiment of the invention, the resistive layer also comprises chemically active substances or getter substances, in particular in order to achieve a gettering action of oxygen and water and to increase the service life of the OLED according to the invention. Suitable getter substances in this context include $P_2O_5$, $CuO$ or $Al_2O_3$. These substances may chemically bond water of crystallization or take it up in their lattice, so that they act in particular as drying agents.

Various processes are suitable for the application of the structured resistive layer. Inter alia, the application of the resistive layer may involve the application of a layer by electrophotographic coating, as takes place in principle in a laser printer or a photocopier.

The application of a fluid coating material, such as in particular a lacquer, and solidification of the coating material is also suitable for producing structured resistive layers according to the invention. The fluid coating material may in this case be selected in such a way that, on account of the interfacial tension, perpendicular surface regions are not formed at the edge of the structure or structures. This is the case in particular if a fluid coating material which wets the material of the surface of the substrate is selected for production of the resistive layer, so that an acute contact angle is formed. This effect can also advantageously be utilized in electrophotographic coating if the coating material applied is melted and the molten coating material wets the surface of the substrate.

The solidification of the coating material may advantageously comprise the crosslinking and/or drying of the coating material. A crosslinked resistive layer is particularly resistant to solvent from further layers which are deposited from the liquid phase, for example by dip coating or spin coating.

A fluid coating material can advantageously be applied by printing by means of a computer-controlled print head, such as in particular an inkjet print head, printing by screen printing or by spraying through a mask. Of course, these processes can also be combined with one another.

On account of the complexity of producing the screen, however, screen printing is less suitable for the application of individual structures. According to one embodiment of the invention, therefore, the process for producing OLEDs comprises the production of the resistive layer without the use of screen printing.

The coating material may comprise a light-curable lacquer, in particular a UV-curable lacquer, with the result that the lacquer can be solidified by exposure. However, it is also possible to dispense with an additional step of exposure and developing on the substrate or with the use of photoresists if, for example, a directly structuring application process is used.

The solidification of a coating for production of a structured resistive layer can advantageously also be effected by means of a beam which is screened over the coated surface. For example, the solidification of a light-curable resist layer may be effected by structured exposure, for example by means of a screened laser beam. The solidification of a coating by means of a screened beam makes it possible, with the aid of suitable computer control of the beam or a suitable mask, to simply and directly transfer motifs to the resistive layer and therefore to the lateral structure of the luminous area.

To produce structured resistive layers by means of structured irradiation for example by means of a screened beam, there are, of course, other options. Suitable preliminary coatings, such as solutions of layer-forming materials, two-component mixtures, monomers or polymers, solgels or powders can be applied to the substrate by liquid application, powder coating, contact transfer or by laying on a sheet. The beam used may in general terms, depending on the coating material, be, for example, coherent or incoherent light, ultraviolet, visible or infrared light, an electron beam or an ion beam. In addition to crosslinking, the solidification of the preliminary coating by the beam may also be effected by fusion, fixing or adhesive bonding.

According to one embodiment of the process, the application of at least one resistive layer having at least one structure comprises the melting of solid coating material, in particular in the form of a preliminary coating. The melting and the resultant brief liquefaction makes it easy to create a resistive layer structure with shallow edges when the molten material wets the substrate. For this purpose, the application of the resistive layer may, for example, involve the application of a layer by application of a powder, in particular of a pulverulent polymer or lacquer, and the solidification of the coating material by fusion. The fusion can in turn be achieved by supplying energy in a furnace by irradiation by means of light, in particular by infrared or laser exposure, by microwave radiation, electron or particle radiation or induction. The supply of energy may also be effected by a locally varying intensity. In this way it is possible, for example, to produce a structured resistive layer from an unstructured preliminary coating by the preliminary coating being locally melted and then solidified again.

Apart from these variants of the process according to the invention, the resistive layer can also be applied by means of a transfer. For this purpose, the transfer may include the motif of the luminous area in negative form. One advantage of this refinement of the process according to the invention is that transfers can be produced on a conventional printer without major technical outlay. For example, a customer can produce the desired motifs himself in the form of transfer films which are then processed further to form OLEDs with a self-luminous display surface. The transfer can likewise be melted at least in regions in order to produce a corresponding structure with edges which drop at an acute angle.

Furthermore, the application of the resistive layer may also comprise the deposition of a resistive layer by vapor phase coating, such as for example by chemical vapor deposition (CVD). Deposition by means of CVD offers the advantage, inter alia, that, as with electrophotographic coating, there are no drying or curing times. Moreover, various materials, in particular inorganic materials, can be deposited by means of CVD coating. For example, by means of CVD, it is possible to deposit an $SiO_2$ layer as insulation layer, which is advantageous in particular on account of its good insulating properties, its transparency and its hardness. This method can also be used to deposit various oxides and nitrides as resistive layers. Similar advantages are also offered by physical vapor deposition processes, such as for example evaporation coating or sputtering.

According to a further variant of the process according to the invention, the structuring of a photoresist layer by means of gray scale lithography produces a resistive layer with flanks which drop at an acute angle. With gray scale lithography, the layer can deliberately be exposed and developed in such a way that the steep flanks which are formed in conventional lithography, with the drawbacks outlined above, are avoided. However, flanks which are not perpendicular may also be produced, for example, without the use of photoresists, as described above, so that according to one embodiment of the invention photoresist is not used as coating material.

A wide range of materials are suitable for the resistive layer and are selected partly on the basis of the coating process used. For example, in addition to inorganic material the resistive layer may also comprise a thermoplastic or thermoset. These can easily be applied from the liquid phase as a single-component or multicomponent lacquer layer. In particular, thermosets are eminently suitable, since, on account of their crosslinked structure, they are resistant to solvent in subsequently applied layers of the OLED layer assembly. The plastics may also be doped with conductive materials in order to provide a resistive layer with a defined resistance. For this purpose, the layer may, for example, be mixed with carbon or conductive nanoparticles.

To avoid the formation of cords or an inhomogeneous thickness in further layers which are applied, the resistive layer, in addition to having the edge structure without perpendicular wall regions, should also be kept as thin as possible. In particular, layer thicknesses in a range from 0.1 µm to 100 µm are suitable, layer thicknesses in the range between 0.1 µm and 10 µm being preferred. Ultimately, however, the choice of layer thickness is dependent in particular on the local resistance to be achieved and the material used for the resistive layer.

For many applications, it is particularly advantageous if the application of the at least one structure of the resistive layer is individually computer-controlled. This is the case, for example, if the resistive layer is applied to the substrate using a computer-controlled print head, such as for example an inkjet print head which is modified for this purpose, or if a laser beam or a line or array of light, such as for example a line of LEDs, exposes a light-curable lacquer or solidifies and thereby fixes a suitable preliminary coating in a manner which is modulated by computer control.

An electrophotographic process as is carried out in a similar way for coating paper in a laser printer is also suitable for application of an individually patterned or structured resistive layer. The computer-controlled coating or structuring therefore makes it possible to produce OLEDs with individually structured luminous areas in a simple way. This can be used, for example, if the OLEDs must in each case be matched to individual customer specifications. For example, in this way it is possible to produce a set of sighs which are matched to the customer's wishes and many or even all of which have different motifs.

The sequence of the process steps of applying a first conductive electrode layer, of applying a resistive layer having at least one structure, of applying an electroluminescent layer and of applying a second conductive electrode layer is responsible for determining the layer structure of an OLED according to the invention. Accordingly, the sequence can also be varied, the sequence of steps expediently being such that the electroluminescent layer is arranged between the first conductive electrode layer and the second conductive electrode layer, so that a current can flow through this layer as a result of a voltage being applied between the electrode layers.

However, in a preferred embodiment of the process, first of all the first conductive electrode layer is applied to the substrate, and then the resistive layer is applied to the substrate which is coated with the first conductive electrode layer. In this embodiment, therefore, the layer sequence is substrate/first conductive electrode layer/resistive layer/layer assembly which includes at least one electroluminescent layer/second conductive electrode layer.

One of the conductive electrode layers is advantageously transparent or partially transparent to the light which is generated by the electroluminescent layer. Accordingly, one embodiment of the process according to the invention comprises the application of a transparent or partially transparent electrode layer. In this case, either the first electrode layer or the second electrode layer or both electrode layers may be at least partially transparent.

In this context, for visible light transparent conductive oxides (TCOs), such as for example indium tin oxide or tin oxide, are suitable layer materials. However, materials which are not inherently transparent, such as in particular metals, for example gold or silver, may also be transparent or partially transparent to the light emitted if a sufficiently small layer thickness is used or if they are suitably structured, for example in the manner of a perforated mask.

When transparent conductive materials such as indium tin oxide or thin metallic layers are used, the problem generally arises that these layers have a relatively high electrical resistance. Over relatively long distances, this can lead to a voltage drop along the transparent layer and therefore to undesirable lateral brightness fluctuations. Moreover, in this layer power drops across the layer resistance, reducing efficiency and leading to additional heat being evolved. These effects can be effectively reduced if a highly conductive, in particular metallic structure, which is in contact with one of the conductive layers, in particular with a transparent conductive electrode layer, is formed along at least a region which is covered by the resistive layer. The conductive structure is responsible for good distribution of the flowing current and thereby reduces a voltage drop across the resistive layer. The structure may for its part, by way of example, be in the form of a conductive, structured layer.

According to a variant of this embodiment, the conductive structure is arranged on that side of the conductive layer which faces the layer which includes the organic, electroluminescent material. The highly conductive structure may in this case be covered by the resistive layer.

According to a further variant, the highly conductive structure is arranged on that side of the electrode layer which is remote from the layer which includes the organic, electroluminescent material. In this case too, the region of the highly conductive layer on that side of the electrode layer which faces the electroluminescent material may also be covered by the resistive layer.

With the standard layer structure of an OLED, a transparent substrate is selected, the electrode layer applied to it likewise being transparent. The light emitted by the electroluminescent layer applied subsequently then passes out through the substrate. However, a structure in which the electrode layer applied last is transparent to the emitted light and accordingly the light emerges on that side of the OLED layer structure which is remote from the substrate is also possible. With a structure of this type, the substrate does not necessarily need to be transparent.

There are numerous possible uses for an OLED according to the invention. By way of example, an OLED of this type may be used as a luminous or illumination means. On account of its property of being a thin element which emits light over a large area, luminous information or advertising boards or variable signs, for example as pixelated displays, are also particularly suitable. They can also be used for signaling or for ambient lighting for example in the automotive, nautical and aviation sectors and for white goods in the kitchen sector.

Low-resolution displays, as are in widespread use, for example, in pocket calculators, and high-resolution displays can also readily be embodied as OLEDs in virtually any desired size.

Accordingly, a further application area is also digital hoardings and display boards, in which correspondingly large-area pixels are required.

The invention is explained in more detail below with reference to the appended figures, in which identical reference symbols denote identical or similar components and in which:

BRIEF DESCRIPTION OF THE DRAWINGS

FIGS. 3A and 3B show comparative cross-sectional views of structured resistive layers with sharp structure edges and structure edges which drop at an acute angle, FIG. 4 shows an embodiment of the invention with a resistive layer thickness which-varies in steps, FIGS. 7A to 7D show embodiments of OLEDs according to the invention with additional highly conductive structures for assisting the conductivity of one of the electrode layers.

DETAILED DESCRIPTION OF THE INVENTION

Figure 1:
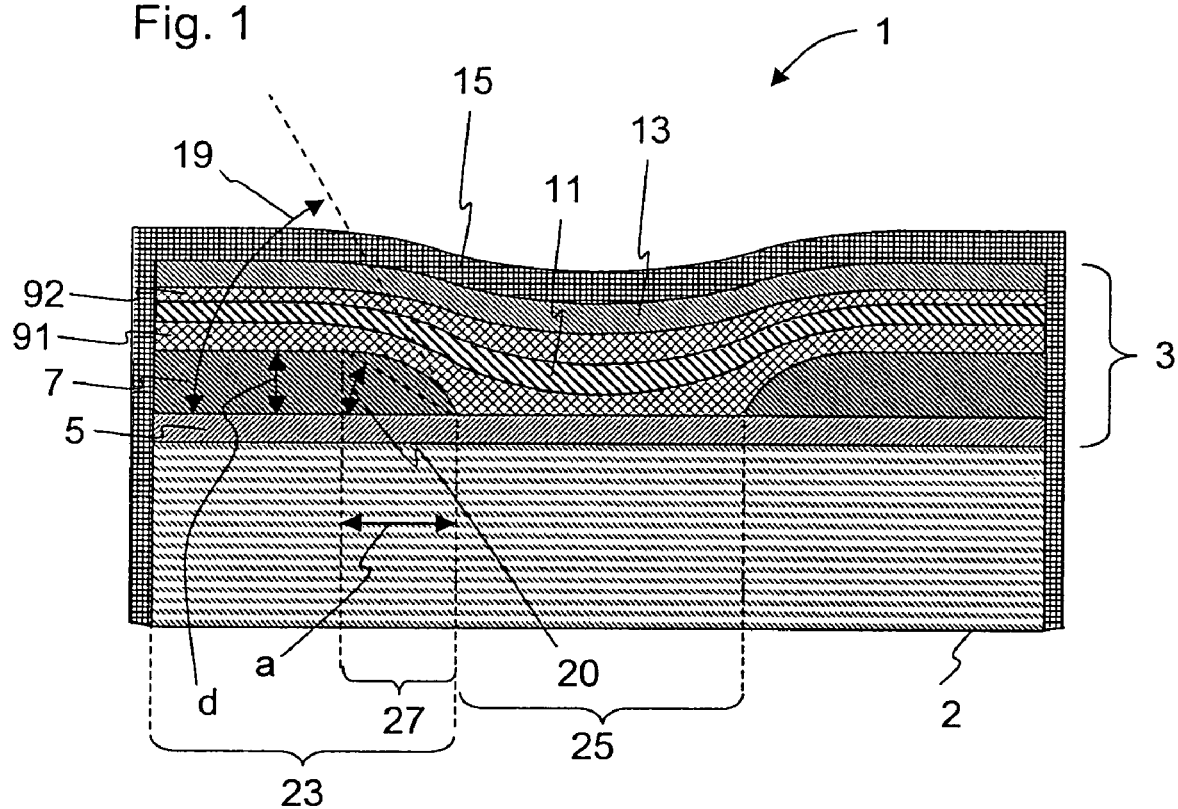
FIG. 1 shows a cross-sectional view through a first embodiment of the invention.

FIG. 1 shows a diagrammatic cross-sectional view through a first embodiment of an OLED according to the invention, which is denoted overall by reference numeral 1.

The OLED 1 comprises a substrate, to which the OLED layer structure, which is denoted overall by 3, is applied. The layer structure comprises a first conductive electrode layer 5, which is applied to the surface of the substrate, a structured resistive layer 7 applied to the electrode layer 5, an electroluminescent layer 11 and further functional layers 91, 92, as well as a second conductive electrode layer 13, which is applied last.

Examples of suitable functional layers for improving the light yield are a potential matching layer, a hole injection layer, an electron blocker layer, a hole blocker layer, an electron conductor layer and an electron injection layer.

To protect the OLED layer structure 3 from harmful effects, the layer structure is also surrounded by an encapsulation 15. This protects sensitive OLED layers in particular from atmospheric constituents, such as water vapor and oxygen, which can react with the layers and lead to a reduction in the service life of the OLED 1.

The substrate and the first conductive electrode layer 5 are preferably transparent or at least partially transparent to the light emitted by the electroluminescent layer 11. For this purpose, the first conductive layer may, for example, be an indium tin oxide layer or a thin transparent metal layer. In this way, the light can pass through the substrate and emerge on the opposite side of the substrate.

However, an inverted OLED layer structure is also possible. In this case, the second conductive electrode layer 13 is transparent and the light passes to the outside through the encapsulation 15, for which a transparent material should then likewise be selected for production of the OLED 1. In this case, the substrate 2 need not be transparent. However, it is, of course, also possible to produce an OLED which is luminous on both sides and in which the light can pass to the outside both through the encapsulation 15 and through the substrate, with both electrode layers 5 and 13 being at least partially transparent.

In its simplest form, the resistive layer 7 is designed as an insulating layer which interrupts the flow of current between anode and cathode, for example between the conductive electrode layers 5, 13.

Figure 2:
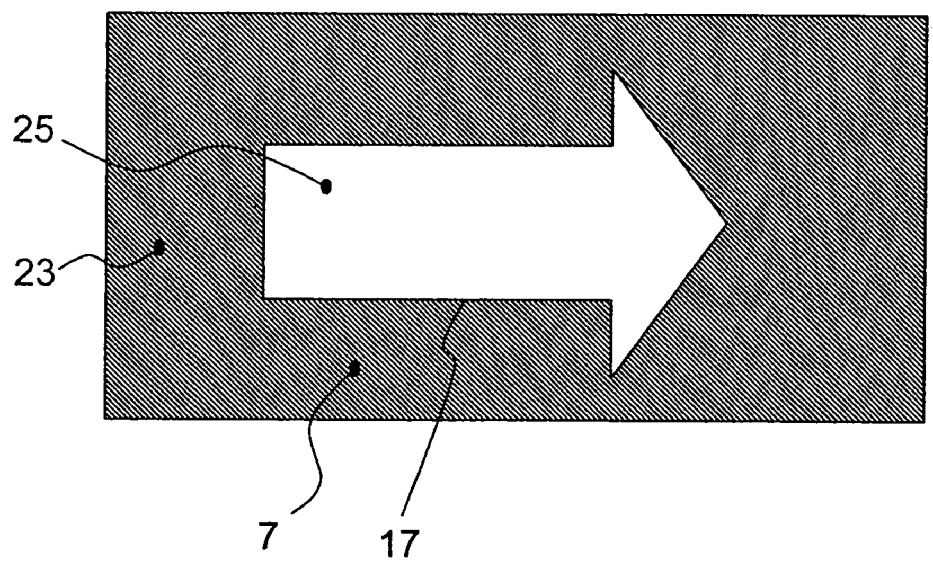
FIG. 2 shows a plan view of a structured resistive layer.

In the embodiment illustrated in FIG. 1, the resistive layer 7 is structured in such a manner that it divides the surface of the substrate 2 into at least one region 23 which is covered by the resistive layer 7 and at least one region 25 which is not covered. FIG. 2 shows a plan view of an example of a structured resistive layer of this type. This comprises a structure 17 in the form of a solid negative arrow, so that the region 25 of the solid arrow is not covered by the resistive layer 7. This region 25 then forms a luminous region of the luminous area of the OLED according to the invention.

The edge region 27 of the structure 17 is indicated in FIG. 1. The edge region is defined by the region within which the resistive layer which has been applied with layer thickness d thins out toward the edge of the structure 17.

The surface of the structure of the resistive layer 7, in particular in its edge region 27, adopts an angle which remains less than 90° with respect to the surface of the substrate. The edge region of the embodiment shown in FIG. 1 has a rounded structure with a contact angle 19. The contact angle, which is the largest angle between the surface of the structure and the surface of the substrate 2 which occurs in this rounded edge region, is in this embodiment even just approximately 60 degrees.

Moreover, the edge region 27 of the resistive layer flattens out toward the edge 29 in such a way that the aspect ratio of the edge region 27 remains less than 1. In the context of the present invention, the term aspect ratio is to be understood as meaning the ratio of the layer thickness d of the resistive layer 7 to the width a of the edge region 27. This therefore also corresponds to the tangent of the mean angle of inclination 20 of the surface of the edge region 27. In the embodiment illustrated in FIG. 1, the aspect ratio is even slightly less than 0.58, corresponding to a mean angle of inclination of 30 degrees.

FIGS. 3A and 3B show, on the basis of cross-sectional views, a comparison between structured resistive layers 7 with sharp structure edges and structure edges which drop at an acute angle in accordance with the invention. FIG. 3A shows a substrate 2 coated with a structured resistive layer 7 in which the edges or flanks of the structure are sharp-edged and substantially perpendicular. Structures of this type are typically formed during photolithographic structuring A layer which is applied subsequently, such as in this case, by way of example, an electroluminescent layer 11, has a significantly reduced layer thickness in the region of the edges of the structure. This leads to considerable deformation to the overall layer structure of the OLED. Furthermore, the flow resistance of the steep edge in the case of coating from the liquid phase can lead to the formation of cords and to lateral inhomogeneities in the layer thickness.

By contrast, with a resistive layer structured in accordance with the invention, as shown in FIG. 3B, the layer thickness of the layer 11 even in the edge region deviates only slightly from the layer thickness in other regions. The edges of the resistive layer according to the invention, which drop at an acute angle, also ensure improved wettability in particular including in the region of the edge 29 of the structures of the resistive layer 7 or subsequent layers. As a result, the formation of cords and bubbles is suppressed in particular during spin coating or dip coating.

The more acute the angle of the edge region 27 toward the edge 29 or the more acute the angle of the surface of the resistive layer with respect to the surface of the substrate, the greater the benefits of the invention become. Therefore, according to one embodiment of the invention, a maximum angle of inclination or contact angle of the structure which is less than 10° is provided.

FIG. 4 shows a cross-sectional view through a further embodiment of the invention, in which the structure 27 of the resistive layer 7 has regions 31, 33 and 35 of differing layer thicknesses. The embodiment shown in FIG. 4 has, by way of example, regions with three different layer thicknesses. The local current flowing through the OLED layer structure between the electrode layers 5 and 13 and therefore the brightness of the local region is in this case dependent on the resistance of the resistive layer in the direction in which the current flows, and this resistance in turn increases as the layer thickness rises. Accordingly, the luminous area will emit least light in the region 35 and most light in the region 25.

Together with the uncoated region 25, the three regions 31, 33, 35 with different layer thicknesses shown by way of example in FIG. 4 can be used to produce four different brightness levels on the luminous area. This corresponds to a color depth of 2 bits.

If a higher color depth is required, it is accordingly possible to select further regions with more finely graduated layer thicknesses. However, to make it possible to generate a color depth of 4 bits, it would have to be possible to graduate the layer thickness in sixteen stages.

Figure 5:
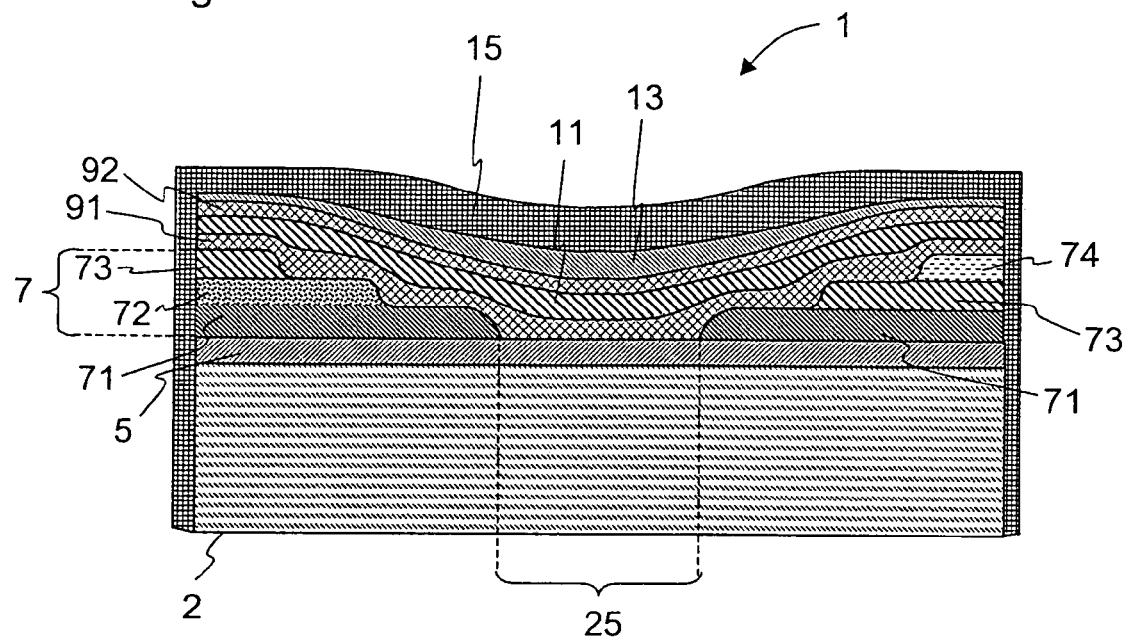
FIG. 5 shows an embodiment of the invention with a multilayer resistive layer.

However, a great color depth can also be produced with a small number of different layers. An example of this type is illustrated in FIG. 5. FIG. 5 shows an embodiment with a multilayer resistive layer 7 in which the individual layers 71, 72, 73 and 74 include different layer materials. These layer materials and the layer thicknesses of the individual layers 71-74 are selected in such a way that the individual layers have a different resistance in the direction in which the current flows, which in this case is substantially perpendicular to the surface of the substrate 2. In this case, the resistance of the individual layers 71–74 is advantageously selected according to the significance of bits of a bit word whose length corresponds to the number of different layers. With four different layers 71–74, the length of the bit word is equal to 4 and the resistance of the individual layers is successively doubled. Accordingly, the resistance of the layer 74 can be selected to be twice as high as the resistance of the layer 73, the resistance of the layer 73 in turn to be twice as high as the resistance of the layer 72, etc. In this way, it is possible to achieve a color depth of the luminous area of 4 bit, i.e. 16 different brightness stages, even using a four-layer resistive layer.

Therefore, if, by way of example, as described above, the resistance of layer 74 is highest and the resistance of layer 71 is lowest, the resistances in each case being halved from layer to layer, in the region which is located on the far left-hand side in FIG. 5, where the layers 71, 72 and 73 lie one on top of the other, a brightness of $9/16$ of the maximum brightness occurring in region 25 is achieved. In the region on the right-hand side of FIG. 5, in which the layers 71, 73 and 74 lie one on top of the other, accordingly, a brightness of $3/16$ of the maximum brightness is achieved.

Figure 6:
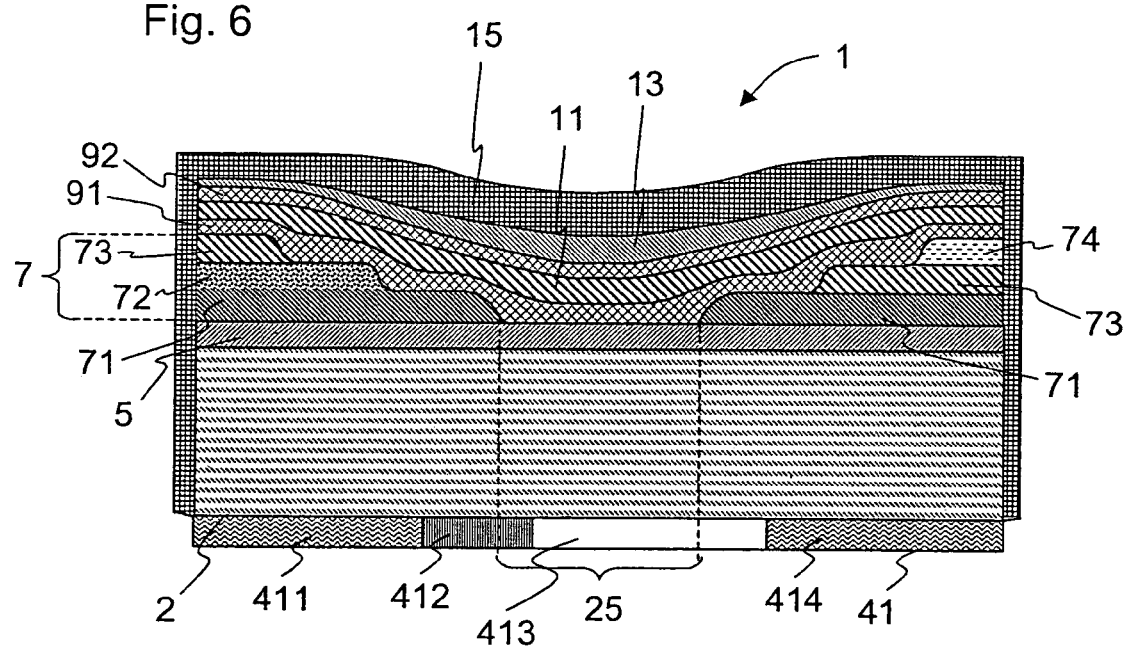
FIG. 6 shows an embodiment with an additional layer for structuring the luminous area.

Another, very simple way of laterally structuring the illumination of the luminous area is shown in FIG. 6. The embodiment of the invention which is illustrated in FIG. 6 has a further layer 41 with a locally varying light absorption produced by laterally varying pigments for locally varying the brightness of the luminous area. In the embodiment shown in FIG. 6, the pigment layer is applied to the outside of the light-discharge side of the OLED 1.

The laterally varying pigmentation of the pigment layer 41 is symbolically indicated in FIG. 6 by differently hatched regions 411 to 414. The regions 411 to 414 may in this case, for example, have a pigmentation with a different density. However, a different pigmentation, unlike a lateral variation in the resistance of the resistive layer 7, cannot just be used to locally define the brightness of the luminous area. Rather, the pigments can also influence the color spectrum of the light emitted by the electroluminescent layer as a result, for example, of colored or fluorescent pigments being introduced into the pigment-layer.

Of course, a pigment layer can be combined not only with an OLED with a multilayered resistive layer, as shown in FIGS. 5 and 6, but also with all other embodiments of the invention.

As an alternative or in addition to the pigment layer 41 illustrated in FIG. 6, it is also possible for the resistive layer 7 to be applied in such a way that it has a single-color or multicolored pattern or image. This can be achieved, for example, by the application of a resistive layer with laterally varying pigments.

It is also possible for the resistive layer to be applied in multilayer form, in which case the successively applied layers may have different colors or shades. In this case, the layers 71, 73 and 74 of the embodiments shown in FIGS. 5 and 6 have different colors or shades, so that additional lateral structuring of these layers results in the formation of a pattern. The resistive layer is preferably also externally visible, so that in this way it contributes to the esthetic impression or to the information content provided.

FIGS. 7A to 7D illustrate two further embodiments of an OLED 1 according to the invention. A common feature of these two embodiments of the OLED is that a highly conductive, preferably metallic structure 80, which is in contact with the transparent conductive electrode layer 5, is formed along a region 23 which is covered by the resistive layer. This additional highly conductive structure reduces voltage drops along the transparent electrode layer 5, which is generally only moderately conductive.

The structure 80 may be in the form of a continuous layer which, when the luminous area is seen in plan view, is configured to match the shape of the region 23. However, other shapes, for example parallel bars running along the region 23, are also possible.

Figure 7A:
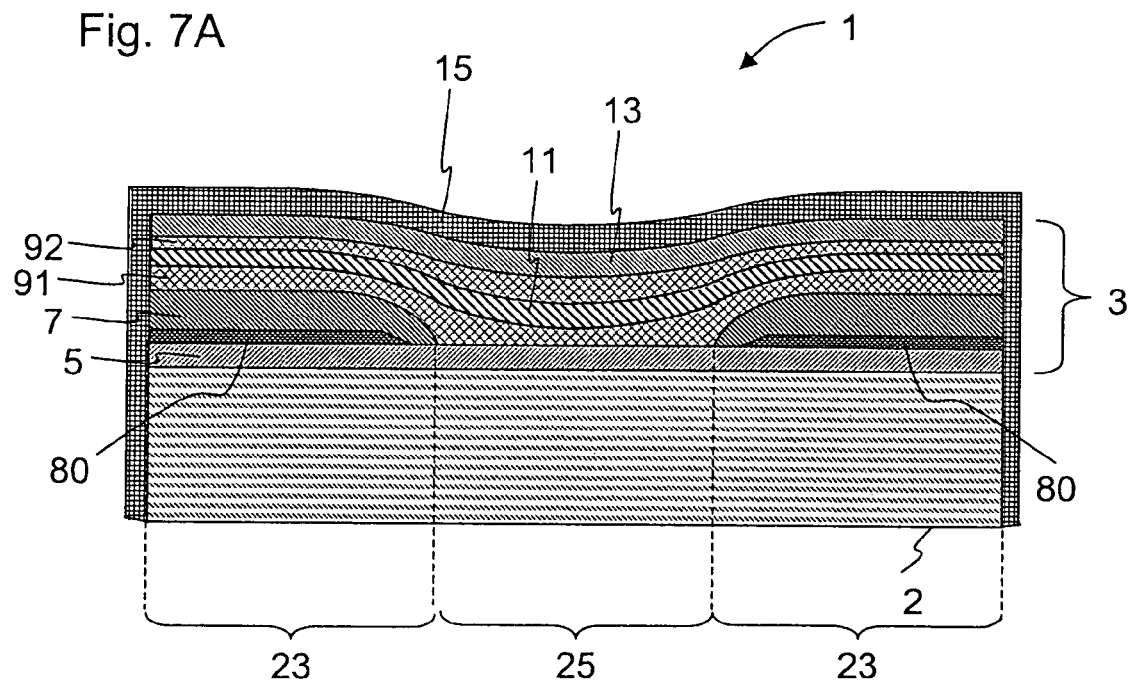

In the embodiment of an OLED which is illustrated in FIG. 7A, the conductive structure 80 has been applied to the first conductive layer 5. In this case, the conductive structure 80 is covered by the structure of the resistive layer 7 applied subsequently. On account of this arrangement, the conductive structure 80 is arranged on that side of the conductive electrode layer 5 which faces the electroluminescent layer 11. In this case, the highly conductive structure can advantageously also be applied in such a way that the surface of the conductive structure, in particular in its edge region, adopts an angle which remains less than 90° with respect to the surface of the substrate, with similar advantages to those achieved with the structure of the resistive layer. In this context, in particular the maximum angle of inclination in the edge region or at the edge may be kept less than 80°, preferably less than 60°, particularly preferably less than 45°.

Figure 7B:
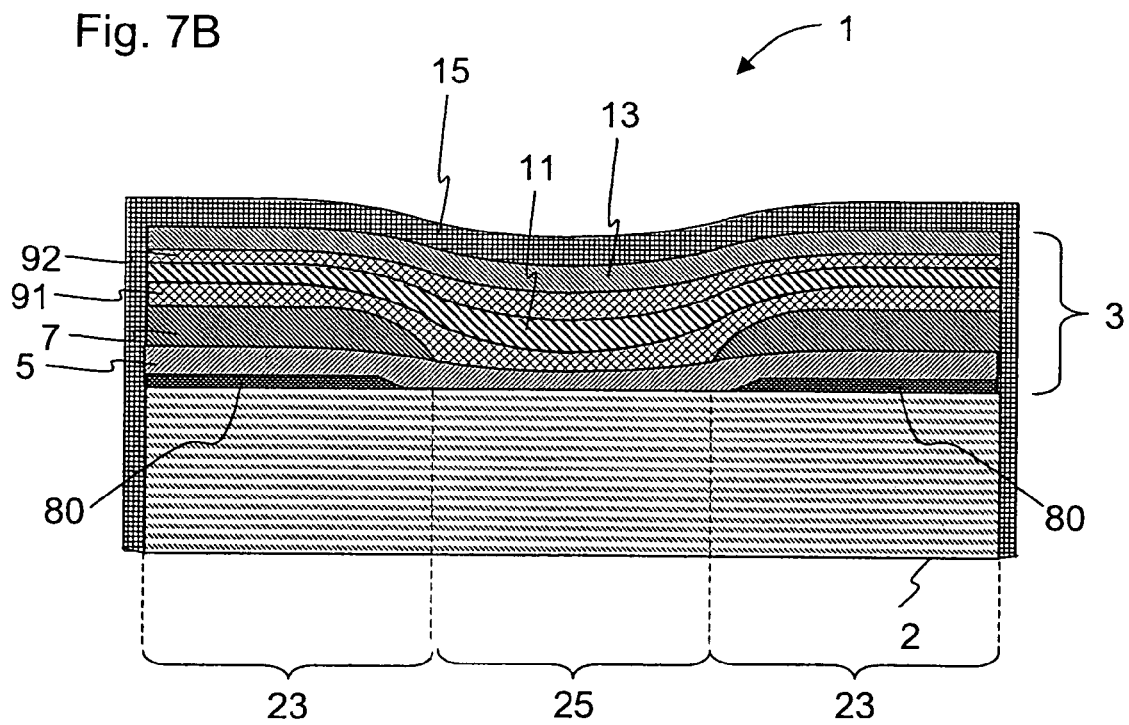

By contrast, in the embodiment illustrated in FIG. 7B, first of all the highly conductive structure 80 has been applied to the substrate. Then, the first electrode layer, followed by the further layers of the OLED, are applied to the substrate 2 which has been prepared in this way. As a result, in this embodiment the highly conductive structure is arranged on that side of the electrode layer 5 which is remote from the layer which includes the organic, electroluminescent material.

Of course, as an alternative or in addition, a highly conductive structure may also be present in order to enhance the conductivity of the second electrode layer 13, in which case the highly conductive structure is accordingly once again arranged in such a way that it extends along a region 23 which is covered by the resistive layer and is in contact with the conductive electrode layer 13.

Exemplary embodiments of this type are illustrated in FIGS. 7C and 7D. With the OLED shown in FIG. 7C, as in the embodiment of the invention illustrated in FIG. 7A, the highly conductive structure 80 is located on that side of the second electrode layer 13 which faces the electroluminescent layer 11. The embodiment shown in FIG. 7D has a highly conductive structure 80 applied to the second electrode layer 13. In both embodiments, the highly conductive structure 80 likewise extends along a region 23 of the substrate which is covered by the resistive layer 7.

The arrangements of OLEDs which are shown in FIGS. 7C and 7D can particularly advantageously also be designed for light to emerge on the opposite side from the substrate, in which case the second electrode layer 13 is at least partially transparent to the light emitted by the electroluminescent layer 11. With an arrangement of this type, it is advantageously also possible for the encapsulation to be designed to be transparent, at least on the light-discharge side of the OLED.

Figure 8:
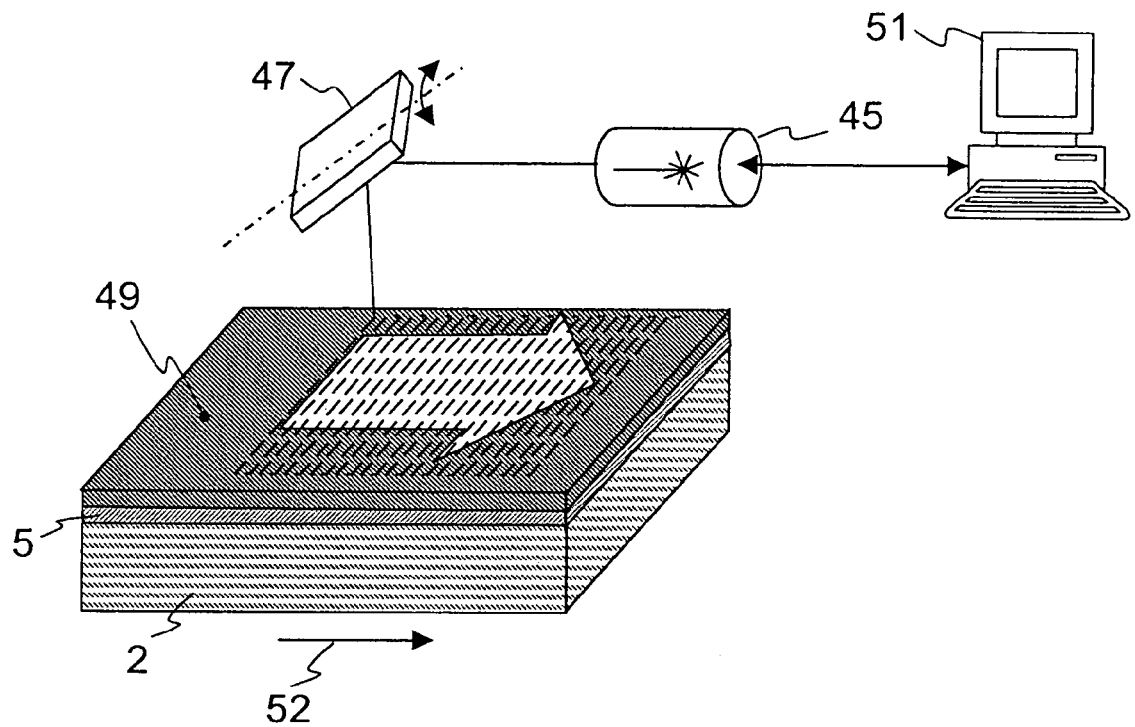
FIGS. 8 to 10 show embodiments of a device for producing a resistive layer which is structured in accordance with the invention.

FIG. 8 shows an embodiment of a device for producing a structured resistive layer. For this purpose, first of all a preliminary coating is applied to the substrate 2 in the form of a layer of light-curable lacquer 49. Then, to solidify the layer of lacquer, a laser beam is screened over the coated surface of the substrate 2. To produce suitable structures, such as for example the solid arrow illustrated by way of example, the laser beam is modulated as a function of the point of incidence on the surface in order to structure the way in which the preliminary coating is exposed. This is achieved by the beam being screened in a laterally targeted fashion over the surface or uniformly screened and intensity-modulated accordingly at the same time. For this purpose, the intensity of a laser 45 is controlled by a computer means 51 connected to the laser, while the laser beam is screened over the surface of the substrate by pivoting a pivoting mirror 47 and advancing the substrate in the direction of advance 52. It is advantageous for the pivoting mirror and the advance also to be controlled by the computer means. In this case, at the locations at which the laser beam impinges on the surface and exposes the lacquer 49, the lacquer is solidified. According to a further embodiment of the invention, a layer of solid coating material, such as for example a layer of pulverulent polymer or lacquer, is applied by means of a device as shown in FIG. 8 and is then solidified by fusion. In this case, the fusion energy required is provided by the incident laser beam, so that a structured resistive layer can be produced by means of the screened and intensity-modulated laser beam. The solidification achieved by fusion, in particular when the substrate is wetted by the fused coating material, leads, furthermore, that the edges of the structure ending at an acute angle and to a contact layer between the resistive layer and the substrate of less than 90° being formed.

Figure 9:
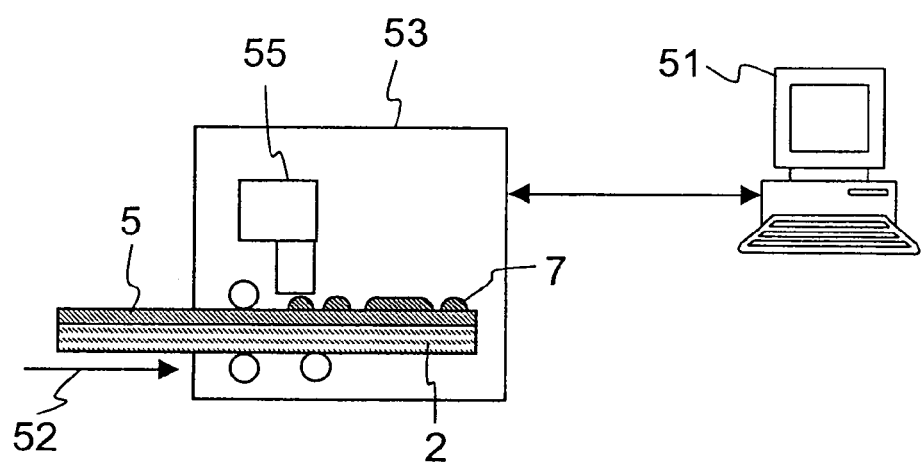

FIG. 9 diagrammatically depicts a further embodiment of a device for applying a resistive layer which is structured in accordance with the invention to a substrate. The device likewise comprises a computer means 51. The computer means 51 controls a printing device 53 having a print head 55. The print head used may, for example, be an inkjet print head which is filled with a suitable lacquer as coating material. In this way, the desired motif of the luminous area of the OLED can be transferred directly to the substrate 2 in the form of a structured resistive layer 7 by means of the computer means 51 together with the printing device connected to it.

Figure 10:
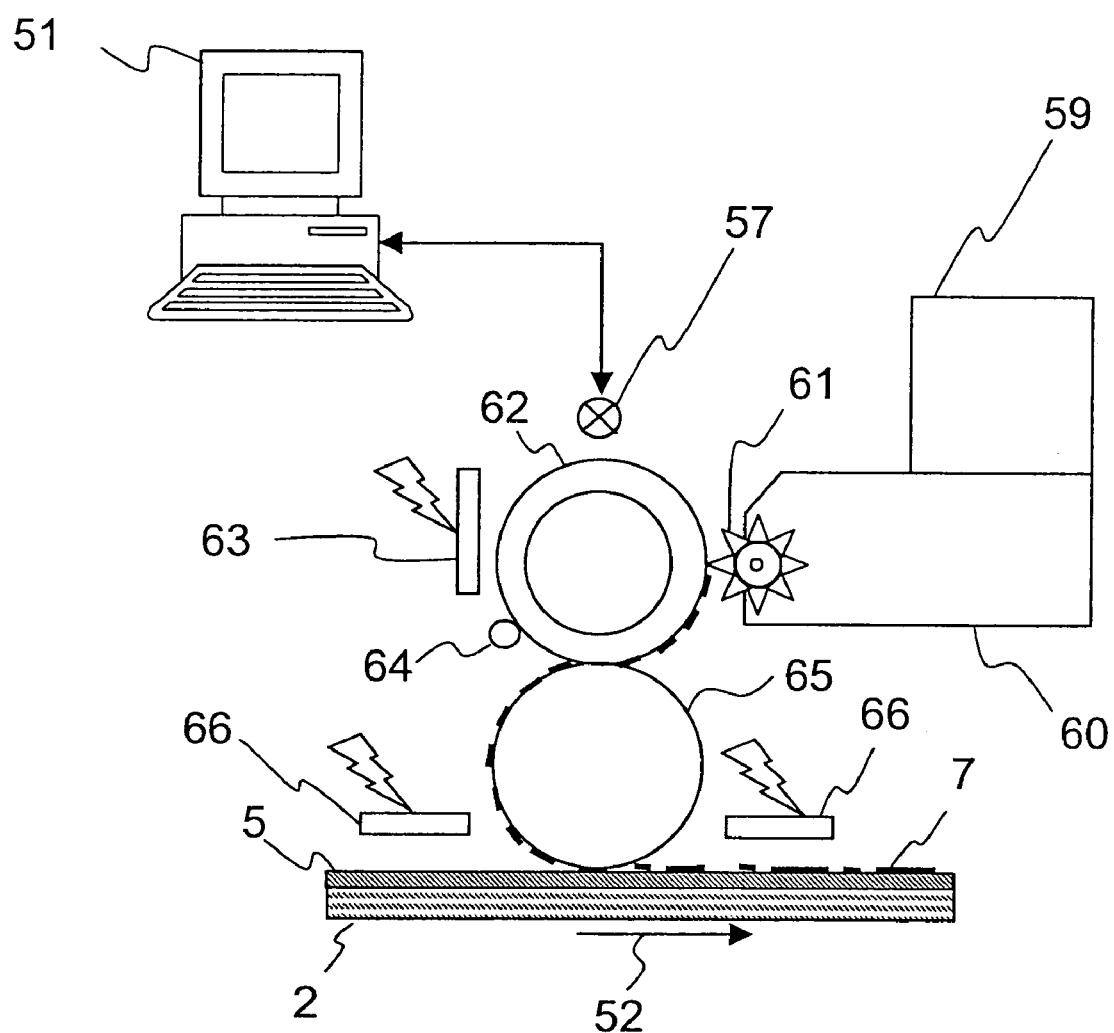

FIG. 10 shows yet a further preferred embodiment of a device for applying a structured resistive layer 7 to a substrate 2. The embodiment illustrated in FIG. 10 is used specifically for the electrophotographic transfer of a resistive or insulating layer to the substrate. In principle, the way in which a device of this type functions corresponds to the way in which a laser printer or photocopier functions.

A photoconductor drum 62 having a carrier material, generally an aluminum drum, a conductive coating, a charge-generating layer, a charge transport layer and a wear-resistant layer rotates, its surface firstly being moved past a cleaning and erasing light unit 64 and then a charging corotron 63, with the result that the latter releases charge to the photoconductor drum 62 and charges the surface of the photoconductor drum 62 uniformly, for example negatively.

The charged surface of the photoconductor drum 62 is then, as a result of its rotation, moved past an imaging system 57, for example an LED array or laser system. This in turn is actuated by a computer means 51, so that the photoconductor drum 62 is exposed according to the motif which is to be transferred to the surface of the substrate 2.

In this case, the light is absorbed at the exposed locations in the charge-generating base layer and positive charges are generated which, on account of the charge transport layer, compensate for the charge at the surface of the photoconductor drum, so that a latent charge image of the motif is formed on the photoconductor drum.

Then, the insulation or resistive material, in the form of a toner from a toner cartridge 59, is transferred to the photoconductor drum 62 by means of a magnetic brush 61 of a developing unit 60. Moreover, for this purpose a bias voltage is applied between the photoconductor drum 62 and the developer unit 60. On account of the difference in potential, the toner adheres only to those regions of the photoconductor drum 62 which have been discharged as a result of the exposure. If the substrate consists of a relatively hard material, such as for example glass, the toner is advantageously not transferred directly to the substrate 2, but rather is firstly transferred from the photoconductor drum 62 to a transfer drum 65 and only then to the substrate 2. The transfer drum has a soft surface, for example made from rubber, silicone or EPDM, which can be well matched to the surface of the substrate 2, so that good contact between the substrate and the toner on the transfer drum 65 is achieved.

The substrate is likewise charged uniformly with a transfer corotron 66, so that the toner is taken from the transfer drum 65. As an alternative to charging by means of a transfer corotron 66, it is also easily possible to achieve uniform charging by direct electrical contact with a voltage source, since the surface of the substrate 2, on account of the prior coating with a conductive electrode layer 5, has a good conductivity and the charge is distributed uniformly. In a subsequent fixing operation, the surface which has been coated with the toner is heated to a moderate temperature of below 250° C., typically between 120 and 180° C., and the toner is solidified.

A further process variant of the electrophotographic coating provides for the substrate 2 to be heated in advance, for example to a temperature of <200° C., preferably between 100° C. and 150° C., and for the resistive or insulating material, in the form of a toner, then to be transferred by means of contact with the transfer drum 65. In this case, there is no need for the toner to be fixed following the transfer. In this case, the transfer corotrons 66 referred to above can also be dispensed with.

This operation of applying a resistive layer with at least one structure is advantageous, inter alia, because the coating can be carried out relatively quickly and there is no need for a drying phase.

With an electrophotographic coating of this type, it is possible to achieve a lateral resolution in the structure of <100 μm, preferably <50 μm. It is possible to carry out both gray scale printing with a variable layer thickness, for example with a layer thickness of between 1 μm and 8 μm, and halftone printing in order to achieve graduated brightnesses of the luminous image. In addition, if colored toners are used, it is possible to produce colored resistive layers. The fixing operation with fusion of the toner particles also leads in particular to rounding of the edge region, with the result that the structures do not have any steep flanks.

By repeating the printing operation a number of times, it is also easy to apply a structure of the resistive layer in such a way that it has regions with layer thicknesses which vary in steps. It is also possible, by repeating the printing operation a number of times with differently colored toners, to produce multicolored prints in order to improve the functionality or the esthetic appearance of the visible resistive layer.

In addition to the non-impact printing processes described above, the resistive layer can also be applied using processes which require a mask or the like. Examples of these include screen printing or flexographic printing processes. However, in this case individually configuring the resistive layer in small runs is generally more time-consuming and expensive on account of the need to produce the mask.

LIST OF REFERENCE SYMBOLS

1 OLED
2 Substrate
3 OLED layer assembly
5 First conductive layer
7 Resistive layer
91, 92, . . . , 9N Functional layers
11 Electroluminescent layer
13 Second conductive layer
15 Encapsulation
17 Structure of 7
19 Contact angle
20 Mean angle of inclination
23 Covered region
25 Uncovered region
27 Edge region of 17
29 Edge of 17
31, 33, 35 Regions of 17 with different layer thicknesses
71–74 Layers of 7 with different layer materials
41 Pigment layer
411–414 Differently pigmented regions of 41
45 Laser
47 Pivoting mirror
49 Light-curable lacquer layer
51 Computer means
52 Direction of advance
53 Printing device
55 Print head
57 Imaging system
59 Toner cartridge
60 Developer unit
61 Magnetic brush
62 Photoconductor drum
63 Charging corotron
64 Cleaning and erasing light unit
65 Transfer drum
66 Transfer corotron
80 Highly conductive structure

The invention claimed is:

1. A process for producing an organic light-emitting diode having a substrate, comprising:
   applying a first conductive electrode layer to said substrate;
   applying at least one resistive layer having at least one structure to said first conductive electrode layer;
   applying at least one electroluminescent layer to said at least one resistive layer; and
   applying a second conductive electrode layer to said electroluminescent layer, wherein said at least one structure has an edge region that adopts an angle which remains less than 90° with respect to a surface of the substrate.

2. The process as in claim 1, wherein said angle remains less than 60°.

3. The process as in claim 1, wherein said at least one resistive layer defines a contact angle between said at least one structure and said surface is less than 60°.

4. The process in claim 3, wherein said contact angle remains less than 10°.

5. The process as in claim 1, wherein said first conductive electrode layer or said second conductive electrode layer comprises a transparent or partially transparent electrode layer.

6. The process in claim 1, further comprising applying said at least one resistive layer such that the aspect ratio of said edge region remains less than 1.

7. The process in claim 6, wherein said aspect ratio remains less than 0.58.

8. The process as in claim 1, wherein the application of said at least one resistive layer comprises an electrophotographic coating process.

9. The process as in claim 1, wherein the application of said at least one resistive layer comprises applying a lacquer and solidifying said lacquer.

10. The process as in claim 9, wherein said lacquer wets said surface of said substrate.

11. The process as in claim 9, wherein solidifying said lacquer comprises a step selected from the group consisting of cross-linking, drying, and any combinations thereof.

12. The process as in claim 9, wherein applying said lacquer comprises a step selected from the group consisting of printing by means of a computer-controlled print head, printing by screen printing, spraying through a mask, and any combinations thereof.

13. The process as in claim 9, wherein said lacquer comprises a light-curable lacquer, and wherein solidifying said lacquer comprises exposing said lacquer to light.

14. The process as in claim 1, wherein applying said at least one resistive layer comprises applying a preliminary coating and solidifying said preliminary coating via a screened beam.

15. The process as in claim 1, wherein said at least one electroluminescent layer comprises two electroluminescent layers.

16. The process as in claim 15, wherein applying said two electroluminescent layers comprises spin coating or dip coating.

17. The process as in claim 1, wherein applying said at least one resistive layer comprises fusing a solid coating material.

18. The process as in claim 1, wherein applying said at least one resistive layer comprises applying a layer of powder and fusing said layer of powder.

19. The process as in claim 18, wherein fusing said layer of powder comprises irradiating said layer of powder with energy selected from the group consisting of light, infrared light, laser light, microwave radiation, electron radiation, particle radiation, and induction.

20. The process as in claim 18, further comprising locally varying intensity of said energy.

21. The process as in claim 1, wherein said at least one resistive layer is applied to a thickness in a range from about 0.1 μm to about 100 μm.

22. The process as in claim 1, wherein applying said at least one resistive layer comprises a process selected from the group consisting of a transfer process, an evaporation coating process, a sputtering process, and a chemical vapor deposition process.

23. The process as in claim 1, wherein said at least one structure comprises regions with different layer thicknesses.

24. The process as in claim 23, wherein said regions with different layer thicknesses are produced by repeat coating.

25. The process as in claim 1, wherein applying said at least one resistive layer comprises applying in succession a plurality of resistive layers with different coating materials.

26. The process as in claim 1, further comprising applying a pigmented layer to locally vary the brightness of said at least one electroluminescent layer.

27. The process as in claim 1, wherein applying said at least one resistive layer comprises applying in succession a plurality of resistive layers having different colors or shades.

28. The process as in claim 1, wherein applying said at least one resistive layer comprises laterally varying pigments in said at least one resistive layer.

29. The process as in claim 1, wherein applying said at least one resistive layer comprises applying a resistive layer having a grid structure.

30. The process as in claim 1, further comprising forming a conductive metallic structure along at least said edge region.

31. The process as in claim 30, wherein said conductive metallic structure is arranged on a side of said first or second conductive electrode layer proximate said at least one electroluminescent layer.

32. The process as in claim 30, wherein said conductive metallic structure is arranged on a side of said first or second conductive electrode layer remote from said at least one electroluminescent layer.

33. An organic light-emitting diode comprising:
a substrate having a surface;
a first conductive electrode layer being on said substrate;
at least one electroluminescent layer;
a second conductive electrode layer; and
a resistive layer having at least one structure, said at least one structure having an edge region with an angle which remains less than 90° with respect to said surface.

34. The diode as in claim 33, wherein said angle remains less than 60°.

35. The diode as in claim 33, wherein said at resistive layer defines a contact angle between said at least one structure and said surface is less than 60°.

36. The diode as in claim 33, wherein said edge region defines an aspect ratio of less than 0.58.

37. The diode as in claim 35, wherein said angle or said contact angle remains less than 10°.

38. The diode as in claim 33, wherein said at least one electroluminescent layer is applied by liquid coating.

39. The diode as in claim 33, wherein said surface comprises at least one covered region covered by said at least one resistive layer and at least one non-covered region not covered by said resistive layer.

40. The diode as in claim 39, further comprising a conductive metallic structure extending along said at least one covered region and being in contact said first or second conductive electrode layers.

41. The diode as in claim 40, wherein said conductive metallic structure is arranged between said first conductive electrode layer and said electroluminescent layer or between said second conductive electrode layer and said electroluminescent layer.

42. The diode as in claim 41, wherein said conductive metallic structure is arranged on a side of said first or said second conductive electrode layer opposite said electroluminescent layer.

43. The diode as in claim 33, wherein said resistive layer is on said first conductive electrode layer.

44. The diode as in claim 33, wherein at least one of said first and second conductive electrode layers is transparent or partially transparent to light generated by said at least one electroluminescent layer.

45. The diode as in claim 33, wherein at least one of said first and second conductive electrode layers comprises a transparent conductive oxide.

46. The diode as in claim 45, wherein said transparent conductive oxide is indium tin oxide or tin oxide.

47. The diode as in claim 33, wherein said resistive layer has a thickness in a range from about 0.1 µm to about 100 µm.

48. The diode as in claim 47, wherein said range is from about 1 µm to about 10 µm.

49. The diode as in claim 33, wherein said at least one structure comprises a plurality of regions having different electrical resistances in a direction in which current flows.

50. The diode as in claim 33, wherein said at least one structure comprises a plurality of regions having different layer thicknesses.

51. The diode as in claim 33, wherein said resistive layer comprises a plurality of layers comprising different layer materials.

52. The diode as in claim 51, wherein said resistive layer when externally viewed has a single-color or a multicolor pattern or image.

53. The diode as in claim 33, wherein said resistive layer comprises a plurality of layers having different colors.

54. The diode as in claim 33, wherein said resistive layer comprises getter substances.

55. The diode as in claim 33, wherein said substrate is transparent to light emitted by said electroluminescent layer.

56. The diode as in claim 33, further comprising a lateral variation light absorption layer.

57. The diode as in claim 33, wherein said at least one structure comprises a grid structure.

58. The diode as in claim 33, wherein said resistive layer comprises an insulation layer.

59. The diode as in claim 33, wherein the diode can be used as a device selected from the group consisting of a luminous means, an illumination means, a luminous advertising board, a variable sign, a signaling light, a high-resolution display, a low-resolution display, and a digital advertising board.

* * * * *